(12) United States Patent
Simonov

(10) Patent No.: US 9,823,653 B2
(45) Date of Patent: Nov. 21, 2017

(54) METHOD AND DEVICE FOR MANAGING ELECTRIC ENERGY CONSUMPTION AND/OR PRODUCTION

(75) Inventor: Mikhail Simonov, Turin (IT)

(73) Assignee: ISTITUTO SUPERIORE MARIO BOELLA SULLE TECHNOLOGIE DELL'INFORMAZIONE E DELLE TELECOMMUNICAZIONI, Turin (IT)

( * ) Notice: Subject to any disclaimer, the term of this patent is extended or adjusted under 35 U.S.C. 154(b) by 454 days.

(21) Appl. No.: 13/994,254

(22) PCT Filed: Dec. 28, 2011

(86) PCT No.: PCT/IB2011/055991
§ 371 (c)(1),
(2), (4) Date: Jun. 14, 2013

(87) PCT Pub. No.: WO2012/090169
PCT Pub. Date: Jul. 5, 2012

(65) Prior Publication Data
US 2013/0268135 A1 Oct. 10, 2013

(30) Foreign Application Priority Data
Dec. 28, 2010 (IT) .......................... TO2010A001076

(51) Int. Cl.
G05B 23/02 (2006.01)
G01D 4/00 (2006.01)
(Continued)

(52) U.S. Cl.
CPC ............. *G05B 23/02* (2013.01); *G01D 4/004* (2013.01); *G01R 21/1336* (2013.01);
(Continued)

(58) Field of Classification Search
CPC ........ G01D 4/004; G01R 22/06; G01R 22/10; G01R 22/068; G05B 23/0205;
(Continued)

(56) References Cited

U.S. PATENT DOCUMENTS 4,370,723 A * 1/1983 Huffman ................... H02J 3/14
307/35
7,216,021 B2 * 5/2007 Matsubara ................ H02J 3/00
700/22

(Continued)

FOREIGN PATENT DOCUMENTS

DE        195 35 719 A1    3/1997
WO       2008/118396 A1   10/2008

OTHER PUBLICATIONS

BizEE, "kW and kWh Explained", Jul. 24, 2016 (accessed from <<http://www.energylens.com/articles/kw-and-kwh>> on Jul. 26, 2016).*

(Continued)

*Primary Examiner* — Kenneth M Lo
*Assistant Examiner* — Michael J Huntley
(74) *Attorney, Agent, or Firm* — Workman Nydegger

(57) ABSTRACT

A method of managing electric energy consumption and/or production dynamics, includes the steps of: sampling an electric energy flow, adapted to be measured by an electricity metering device (1) within a network (15) of an electrical company; calculating a variation $\Delta E_i = (E_i - E_{i-1})/\Delta t$ at regular intervals, where $E_i$ and $E_{i-1}$ are two integral sum values of electric energy amounts consolidated over a given number of cycles and $\Delta t$ represents a time interval between the respective times at which the two values are obtained; adding the variation ($\Delta E_i$) to analogous variations calculated at previous times, to obtain a cumulative sum of such variations; determining whether the variation and/or the cumulative sum exceed a predetermined threshold value (Continued)

($\delta_{DE}$); transmitting a message over the network (15) from the electricity metering device (1) if the variation and/or cumulative sum exceed the predetermined threshold value ($\delta_{DE}$).

21 Claims, 6 Drawing Sheets

(51) Int. Cl.
    *H02J 3/00* (2006.01)
    *H02J 3/14* (2006.01)
    *G01R 21/133* (2006.01)
    *H02J 13/00* (2006.01)
(52) U.S. Cl.
    CPC ............... *H02J 3/008* (2013.01); *H02J 3/14* (2013.01); *H02J 13/002* (2013.01); *H02J 2003/003* (2013.01); *H02J 2003/143* (2013.01); *Y02B 70/3225* (2013.01); *Y02B 70/3266* (2013.01); *Y02B 90/242* (2013.01); *Y02B 90/245* (2013.01); *Y02B 90/246* (2013.01); *Y02B 90/2615* (2013.01); *Y02E 60/74* (2013.01); *Y04S 10/30* (2013.01); *Y04S 20/222* (2013.01); *Y04S 20/242* (2013.01); *Y04S 20/322* (2013.01); *Y04S 20/40* (2013.01); *Y04S 20/42* (2013.01); *Y04S 40/121* (2013.01); *Y04S 50/10* (2013.01)
(58) Field of Classification Search
    CPC ............ G05B 23/0286; G05B 23/0289; G05B 23/0291; G05B 23/0294; H02J 3/14; Y02B 70/3225; Y02B 90/242; Y02B 90/2615
    USPC .......................................................... 700/291
    See application file for complete search history.

(56) References Cited

U.S. PATENT DOCUMENTS

| | | | | |
|---|---|---|---|---|
| 7,260,487 B2* | 8/2007 | Brey | ..................... | G06F 1/3203 700/22 |
| 7,355,301 B2* | 4/2008 | Ockert | ..................... | H02J 3/46 307/29 |
| 8,086,355 B1* | 12/2011 | Stanczak | .............. | H02H 1/0092 323/282 |
| 8,171,364 B2* | 5/2012 | Veillette | ................. | G01D 4/004 370/338 |
| 8,457,801 B2* | 6/2013 | Currie | ..................... | H02J 3/005 700/291 |
| 8,478,451 B2* | 7/2013 | Li | ............................. | G06F 1/26 700/291 |
| 8,849,472 B2* | 9/2014 | Pugh | ..................... | G01D 4/002 307/29 |
| 2006/0161310 A1* | 7/2006 | Lal | ............................ | H02J 3/00 700/295 |
| 2006/0229768 A1* | 10/2006 | Chassin | ................... | H02J 3/14 700/295 |
| 2008/0042874 A1 | 2/2008 | Rogai | | |
| 2008/0234957 A1* | 9/2008 | Banhegyesi | ........... | G01D 4/004 702/64 |
| 2008/0238710 A1* | 10/2008 | Tolnar | .................... | G06Q 10/06 340/870.01 |
| 2008/0255782 A1* | 10/2008 | Bilac | ..................... | H02J 13/001 702/62 |
| 2009/0062970 A1* | 3/2009 | Forbes, Jr. | ............. | G01D 4/004 700/295 |
| 2010/0145534 A1* | 6/2010 | Forbes, Jr. | ............. | G06Q 10/00 700/291 |
| 2010/0270933 A1* | 10/2010 | Chemel | ................ | H05B 37/029 315/130 |
| 2011/0012427 A1* | 1/2011 | Craig | ........................ | H02J 3/14 307/29 |
| 2011/0035078 A1* | 2/2011 | Jackson | ................ | G06F 1/3203 700/300 |
| 2011/0071694 A1* | 3/2011 | Mammone | ............. | G06Q 30/02 700/291 |
| 2011/0172841 A1* | 7/2011 | Forbes, Jr. | ............. | G01D 4/004 700/292 |
| 2011/0282510 A1* | 11/2011 | Son | ..................... | G06Q 30/0283 700/295 |
| 2011/0301889 A1* | 12/2011 | Naffziger | ................ | G06F 1/206 702/62 |
| 2013/0191103 A1* | 7/2013 | Chu | .................... | G06F 17/5036 703/14 |
| 2014/0084685 A1* | 3/2014 | Bienfang | .................. | H02J 7/00 307/23 |
| 2015/0001939 A1* | 1/2015 | Kojima | .................... | G06G 7/14 307/52 |

OTHER PUBLICATIONS

Web Enabled Meter: *WEM-MX*, Installation and Operation Manual, XP055006869, Aug. 19, 2008 pp. 1-46.
C. Rhodes, *Electricity Metering*, XP055007296, Sep. 11, 2010, pp. 1-4. http://www.xylenepower.com/Electricity%20Metering . htm.
International Search Report dated May 7, 2012, issued in PCT Application No. PCT/IB2011/055991 filed Dec. 28, 2011.
Written Opinion dated May 7, 2012, issued in PCT Application No. PCT/IB2011/055991 filed Dec. 28, 2011.
Femto, Electrix the Energy Saving Technology, Oct. 14, 2009, 4 pages, www.Electrex.it/prodotti/contatorianalizzatori.
A.G. Phadke, *Synchronized Phasor Measurements—A Historical Overview*, Transmission and Distribution Conference and Exhibition 2002: Asia Pacific. IEEE/PES, vol. 1, Oct. 2002, pp. 6-10.
M. Simonov et al., *Modello di gestione dell'energia solare in tempo reale*, Journal AEIT, vol. 1, Feb. 2011, pp. 24-29.
C. Rhodes, *Xylene Power Ltd, Electricity Metering*, 4 pages, www.xylenepower/com/Electricity_Metering.htm, Sep. 11, 2010.
Enel web page, www.enel.com/it-IT/innovation/smart_grids/smart_metering/telegestore, at least as early as Dec. 27, 2010.
Energy Tracking—Real Time Tracking of Energy, www.energytracking.com, at least as early as Dec. 27, 2010.

* cited by examiner

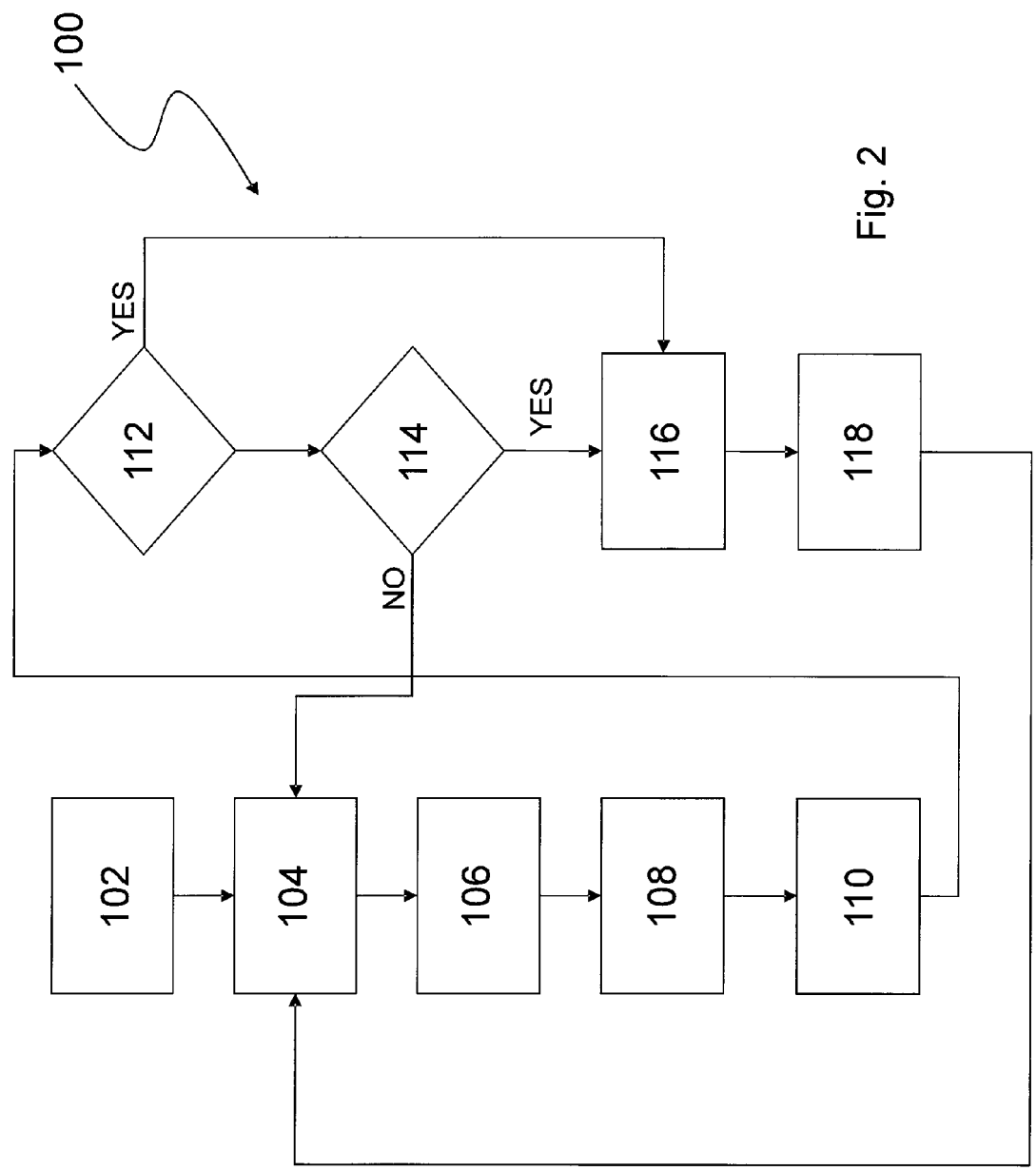

```
DeltaDE := const; // total Delta DE value preset or determined by GA, e.g. 50, 100 ecc.
DE := 0;        //DE, or Digital Energy
Eprev := 0;     //initial value, typically zero
Deltap := 0;    //preceding variation
Sum := 0;       //value range, neighborhood [E0-deltade; E0+deltade]
i:= 0;
Ei := 0;
On Timer( clock ) DO   // delivery of new istantaneous values I and V (time ti)
  Ei := Ei + I(ti) * V(ti) * 1; //instantaneous value, time is set as a unit value
  i++;
UNTIL i<k;
// now consolidating these k cycles (10 times the cycle becomes k = 10*k1, k1 = clock sampling)
i:=0;
Deltai := (Ei-Eprev) /1;   //variation of the current step, to be related to "k"
Sum := Sum + Deltai;       //all "minor" variations accumulated from Eprev to now
IF (ABS(Deltai)>DeltaDE) THEN trend := quick; //the last is high enough
IF (ABS(Sum)>DeltaDE) THEN trend := slow; //the sum has raised enough
IF (ABS(Sum)>DeltaDE) OR (ABS(Deltai)>DeltaDE)THEN DO //high variation step or cumulative minor variations
  DE := Sum;  //Eprev + Sum = Ei;
  Send_DE_Message(NodeIdFrom, [To], Eprev, DE, [Ei=Eprev+DE], timestamp, trend); //variant 1
  //Send_DE_Message(NodeIdFrom, [To], Eprev, Ei, [DE=Ei-Eprev], timestamp, trend); variant 2
  //Send_DE_Message(NodeIdFrom, [To], DE,   Ei, [Eprev=Ei-DE], timestamp, trend); variant 3
  //Send_DE_Message(NodeIdFrom, [To], DE, Eprev, [Ei=DE+Eprev], timestamp, trend); variant 4
  //Send_DE_Message(NodeIdFrom, [To], Ei,   DE, [Eprev=Ei-DE], timestamp, trend); variant 5
  //Send_DE_Message(NodeIdFrom, [To], Ei, Eprev, [DE=Ei-Eprev], timestamp, trend); variant 6
  Sum := 0; //sum restarts from zero
  Eprev := Ei; //after commit, time shift: the present "t" becomes past "t-1"
  Deltap := Deltai; //previous variation
ENDIF;
Manage_Metering(); //unchanged metering management
End; //end timer event
```

Fig. 3

Server algorithm i:=0; //counter
Et :=0; //historical unbalance
Ei := 0; //time frame unbalance
Ep :=0; //previous unbalance
Ct := 0; //historical event intensity
Ci := 0; //time frame event intensity
Cp := 0; //previous event intensity Repeat;
   while (Timer.TimeFrame) do
      Ei := Ei + ReceiveDEMessage(); //DE, unbalance
      Ci := Ci +1; //Count(DE)
   endwhile;
   Ct:= Ct+Ci; //total
   Cp := Ci; //prev-next
   Ci := 0; //preparing for next time frame
   Et := Et + Ei; //total
   Ep := Ei; //prev-next
   Ei := 0; //preparing for next time frame
   IF (Anomalous) THEN ReactionSCADA();
   DoEvents; IF (Halt_Event) THEN Abort;
   i++;

Fuzzy logic predicate (for anomalies)

IF C >= Cmin THEN too many events
IF Ei >= Emax THEN abrupt variations; change of state
IF Ep >= Emax THEN accumulating trend; change of state

Fig. 6

METHOD AND DEVICE FOR MANAGING ELECTRIC ENERGY CONSUMPTION AND/OR PRODUCTION

BACKGROUND OF THE INVENTION

1. Field of the Invention

The present invention relates to a method of managing electric energy consumption and/or production dynamics and a device therefor.

2. Present State of the Art

Energy flows in an electric network are not constant with time. At each moment of time, the balance between consumption/demand and production/offer of electric energy in the network is managed by automatic control systems, which process various measures of electrical quantities.

Electronic electricity metering devices are known in the art, which sample electric energy at a high time resolution to obtain instantaneous current and voltage values, and to total/add up the amount of energy flow, and transmit it into the network at regular time intervals ("time-driven" method). This method uses a communication channel through which a given data volume is exchanged between the above mentioned devices and a mainframe located within the network.

Among the various electrical quantities, such as voltages, currents, frequencies, angles/phases, the amounts of energy have a key role. The amount of metered electric energy, which always accounts for the basic components of which it is composed, may be expressed as the arithmetic sum of instantaneous values times the measurement time, according to the formula:

$$E = \int_0^\tau V(t) \cdot I(t) \, dt \approx \sum_{i=0}^{t} [V(t_i) \cdot I(t_i) \cdot \Delta t],$$

where $V(t_i)$ is the instantaneous voltage value at time $t_i$, whereas $I(t_i)$ is the instantaneous current value at time t, and $\Delta t = [t_i - t_{i-1}]$.

With t equal to 15 minutes, what has happened in the recent past can be observed. Assuming that t is 0.1 seconds, electrical events are captured but such knowledge cannot be shared over the network. The factor t sets the trade-off between visibility of electrical processes in their details and the data volume exchanged over the network. In prior art, fiscal electronic electricity meters consolidate the past energy over long time intervals into increasing positive "units", expressed in kWh.

Digital electronic electricity metering devices use the above discrete formula to calculate instantaneous energy values upon which the amount of cumulative energy delivered is in turn calculated (an example of such process is described in www.xylenepower.com/Electricity Metering.htm). The accuracy of the numerical calculation in the discrete space is ensured by a high sampling rate.

Various types of electricity metering devices are known and commercially available. One example of such devices is the electronic meter sold by ENEL, an Italian-based company, which is used in the "Telegestore" system (e.g. see www.enel.com/it-IT/innovation/smart_grids/smart_metering/telegestore).

Typically, an electricity metering device comprises an analogue current and voltage sensing module, a microchip, a digital metering software code implemented in the microchip, a power supply, a communication module for network transmission of the metered values and memory means.

Prior art electricity metering devices are available and used for detecting past values only, such as power consumption data or power generation data at the electric company customer sites with which the metering device is associated. The electricity metering device is owned by the electric company, and the user is allowed no real-time data access. Electronic electricity metering devices measure instantaneous power consumptions in real time, total them and save the consolidated values (units) in the local memory of the electronic metering device, thereby making such values persistent as stored and with no further processing.

Then, the local values are requested by the electric company for billing and alignment of the electronic metering devices, and then said values are transmitted. This usually occurs upon request, with a certain rate, and at predetermined time instants, i.e. in "time-driven" mode. For synchronization of the remote electronic metering devices with those located at the electric company, there is a step in which data are transmitted to the electric company using standard communication protocols, mainly at delayed times. Generally, data transmission may occur in "push" or "pull" mode, i.e. spontaneously or upon request. Prior art electronic meters use the "pull" mode: the electric company queries a device to receive a response.

The metered values are incremental, are typically sampled every 10-60 minutes and are used for billing purposes. Such time window is selected to contain the data volumes to be transmitted, and make them fit for billing, but this makes them unusable for real-time load balancing. For instance, the Italian Telegestore performs data sampling by consolidating measurement every 15 minutes. A meter measures the past behavior of the network node, does not qualify current processes on a given node, does not estimate their future development and does not qualify the state of the node.

Two relevant meter classes are: (a) spectrum analyzers that measure present energy quality parameters and (b) industrial and/or mass-market panel meters, which make their data available over the web, such as WEB-MX (www.energytracking.com) e FEMTO (electrex.it/prodotti/contatori-analizzatori).

These classes of metering devices operate in "slave" mode, make their data available upon request in "pull" mode, and use short-range (WiFi) and/or web-based (Internet IP/FTP/SMTP/POP3/SNTP and others) communication protocols for data communication.

These devices cooperate with another server (master) device for time-driven control at intervals typically longer than 1 minute, but do not support the real-time decision process, because they do not always deliver data on time. Pull mode data requests of serial communication protocols involve a given waiting time to receive the result, which time is always a multiple of the request time (three times in Modbus). Due to this peculiar feature, there will be periods of time in which network events cannot be observed.

Phasor measurement units, or PMU, are also known, which have a real-time operation and transmit digitized values of energy vectors (Phadke, A. G., "Synchronized phasor measurements—a historical overview," Transmission and Distribution Conference and Exhibition 2002: Asia Pacific. IEEE/PES, vol. 1, no., pp. 476-479 vol. 1, 6-10 Oct. 2002). Adjustment of power flows in the transmission network segments is based on the observation of the difference between phasors on both sides (of the segment). This occurs in perfect synchronism over a small number of main segments of the electric network, using GPS devices and restricting use to "outdoor" locations, where satellites (GPS, Galileo, Glonass and the like) are visible. The key feature of the method that uses phasors consists in simultaneously observing pairs of network nodes using PMUs, each of which observes electrical values, calculates phasors and transmits data over the network at a very high rate. This allows comparison of "input" and "output" energy flows on a given circuit segment. Then, a PCD ("Primary Domain Controller") is used to calculate the differences and analyze said combination of values in an intelligent manner, with rules being applied to check for any anomaly. While PMU devices cooperate together, they measure instantaneous observations and cannot handle historical dynamics. PMUs estimate the current state of the system, but are not autonomous in doing so, as they require the presence of a PDC intelligent device which receives combined data pairs and processes them.

PMUs perform intensive calculations by real-time computation of phasor values, but the latter only remain valid during steady-state of the electric system. In the prior art, software procedures are used to characterize and manage energy variations, to log their history and make state changes which procedures impart intelligence to control schemes.

SUMMARY OF THE INVENTION

Prior art electronic meters operating indoors do not allow real-time characterization of the state of the installed node. A number series generated by electronic meters, indicating the amounts of electric energy that have been produced/consumed during given past periods of time $\{(E_1,t_1), (E_2,t_2), (E_3,t_3), \ldots, (E_i, t_i), \ldots \}$ provides a load shape.

The time-driven method has a poor scalability. If measurements are consolidated every 15 minutes, then a daily series will contain 96 values, with the communication channel being always open, except for the time required for measurement communication. With a time-driven process consolidating data every second, 86400 values would have to be transmitted, which would create a network traffic problem and would constitute a practical limitation. None of these devices affords direct management of consumption dynamics by measuring variations of energy flows through a node/section of the electric network.

Therefore, the main object of the present invention is to provide a method of managing electric energy consumption and/or production dynamics and a device therefor, that is adapted to transmit a small amount of data concerning an electricity user associated with the device, to a recipient, e.g. an electrical company.

A further object of the present invention is to provide a method for managing electric energy consumption and/or production dynamics and a device therefor, that can meter the electric energy consumed and/or the electric energy produced by a user.

Another object of the present invention is to provide a method of managing electric energy consumption and/or production dynamics and a device therefor, that allows a user of the device to be aware in real time of any excessive electricity consumption, according to the particular type of contract.

These and other objects of the invention are fulfilled by a method of managing electric energy consumption and/or production dynamics and a device therefor, as claimed in the annexed claims that are integral part of the present description.

In short, the present invention discloses a method of managing electric energy consumption and/or production dynamics, based on a conventional electricity metering device, which is modified and otherwise programmed to obtain a new electric dynamics monitoring and management feature, by extending or replacing the conventional arrangements for metering consumed electric energy. Power system dynamics include production only (Producer) and/or consumption only (Consumer) and/or both production and consumption (Prosumer).

The device of the invention has the same analog inputs as a conventional electronic meter, although it virtually replaces both an electricity production meter and an electricity consumption meter.

The electronic device of the invention may have a user interface, such as a LCD screen, allowing such dynamics to be displayed, with or without energy amounts.

The device of the invention may also have a visual and/or acoustic alarm for notification of the dynamics, and not only the thresholds, e.g. consumption thresholds that may cause electricity cut off if the maximum contract power is exceeded.

The device of the invention has a real-time, continuous operation. Instead of a conventional "time-driven" approach, in which data are transmitted by the meter every given period of time, it uses an "event-driven" approach, in which data are only transmitted upon occurrence of a given event, or a given dynamics. No GPS device is employed, as the device operates at nodes with scalar values. Any synchronization of the device of the invention occurs over the network.

The concept of the present invention consists in metering energy flow transits at a single node/section of the electric network and/or any electric circuit, but at successive times to detect dynamics. This option is based on a physical law: any variation occurring in the electricity flow from one node to another due to an external phenomenon, will be also reflected in an intermediate node of the network topology, although at a different time. Such time shift $t_C=t_A+l_{AC}/v$ affords advanced control where the speed of phenomenon propagation is lower than the speed of electromagnetic wave propagation, i.e. $v_{phenomenon} < v_{emf}$.

Events are no longer transmitted over the network at predetermined intervals of time (e.g. every 15 minutes) or through completed units (kWh), like in conventional meters, but by the provision of significant dynamics data at times compatible with real-time adjustment, on an "event-driven" bases, i.e. when they occur. In other words, an event caused by a phenomenon occurs when the measurement/dynamics falls out of an admitted "variation range". Therefore, the device of the invention has a smart operation due to the rules and the newly programmed application logic.

The device of the present invention sends events in "push" mode. Furthermore, it still ensures compatibility with existing management modes, which means that it can be used by the network for AMM/AMR (Automated Meter Reading and Management) operation. This approach allows analysis and transmission of power system dynamics.

Unlike a prior art smart metering device ("smart meter"), in addition to the microcode-programmed processes for implementing the metering function, which consolidates past amounts, the method of the present invention provides a process for detecting electric energy production/consumption dynamics. This feature involves comparison of current consolidated current and voltage values with values detected in the recent past, i.e. at times $t_{i-n}, \ldots, t_{i-2}, t_{i-1}$.

Therefore, what is transmitted is no longer an absolute value representing the amount of metered electricity, but relative variations, only if (and when) they exceed a given threshold.

The threshold is set to a fixed value; nevertheless, it can also be variable, e.g. as a percent of the metered amounts.

Energy consumption is almost never constant. Electric energy variations occur with time, may be either positive or negative, small or large. The local power system is normally in a steady-state. Any variation/dynamics may alter such steady state of the system, and is thus critical for automatic system control (SCADA).

According to the invention, two types of electricity amount variations may be observed: fast and slow variations.

A dynamic process may exceed the predetermined threshold with a "fast trend". Instead of or in addition to the above, a dynamic process may include a rather long series of minor variations (having a positive, negative or alternate sign), whose sum might remain within certain limits, or whose maximum modulus may become high enough to exceed the predetermined threshold.

These minor variations may be close to a given value and never fall out of predetermined limits, and hence never have an impact on stability, or may sum up to a considerable variation after a given time, by accumulating small individual contributions towards the positive or negative side. This may actually affect stability.

The concept of significant power system dynamics (which is defined as DE o "Digital Energy") is defined as an electrical event caused by an external phenomenon (such as the use of an electrical appliance, the passage of a cloud, a wind gust, etc.) whereby a predetermined threshold $\delta_{DE}$ is exceeded during a given interval of time—of varying length—allowing it to raise enough to cause a state transition of a power system, to cause the loss of a steady-state in a local power system, to trigger a control action or else.

In practice, this involves real-time observation and metering of energy amount values, with the addition of speed monitoring (first derivative) and trend, to ascertain whether the predetermined thresholds are exceeded with slow and/or fast dynamics, which occurs by monitoring the variation range. Therefore, each power system dynamics results from one or more causes.

In the prior art, normality is discriminated from abnormality by providing two different PMUs that observe an electric energy flow within a circuit at the same time in two different places, and by comparing voltage, current and angle values using phasors. An instantaneous difference observed between two distinct observations at two times $t_i$ and $t_j$ shows that a cause-event occurred during $[t_i, t_j]$. The universal cause-and-effect relation combines causes and electric flow variations in the circuit.

The invention suggests to meter the electricity flow through a single network node (a section of the circuit) in time, instead of metering pairs of synchronized phasors in two different places. Any variation/dynamics occurring at the node A (a place) and at the time $t_i$ has an effect on the node B (different place) and at a different time $t_i+\Delta t$. Wherever a variation exists between synchrophasors, an ongoing energy flow variation is ascertained. A significant variation and/or a slow series of captured accumulations anticipates the occurrence of consequences elsewhere, due to the propagation phenomenon, which also extends over time.

If a periodic and constant flow is maintained in the same place $\phi_k(t_j+\Delta t)-\phi_k(t_j)=\text{Const}_1$ (phasors) and $E_m(t_j+\Delta t)-E_k(t_j)=\text{Const}_2$ (energy amount), then a steady state is ascertained. The time difference between phasors $\phi_k(t_j+\Delta t)-\phi_k(t_j)\neq\phi_k(t_j)-\phi_k(t_j-\Delta t)$ and/or amounts $E_k(t_j+\Delta t)-E_k(t_j)\neq E_k(t_j)-E_k(t_j-\Delta t)$ indicates and anticipates the dynamics $E_m(t_j+\Delta t)=E_m(t_j)+E_k(t_j+\Delta t)-E_k(t_j)$, as well as $\phi_m(t_j+\Delta t)=\phi_m(t_j)+\phi_k(t_j+\Delta t)-\phi_k(t_j)$, where m and k designate two places.

In the formula $$i(t) = i_1(t) + i_2(t) \text{ with } i_1(t) = \frac{-V_m}{\sqrt{R^2 + \omega^2 L^2}} \cos\left(\phi - \tan^{-1}\frac{\omega L}{R}\right) e^{-\frac{R}{L}t}$$

and $$i_2(t) = \frac{V_m}{\sqrt{R^2 + \omega^2 L^2}} \cos\left(\omega t + \phi - \tan^{-1}\frac{\omega L}{R}\right),$$

the first term $i_1(t)$ describes the temporary component (i.e. restricted in time), whereas the second term describes the steady component, which stabilizes after a given time. As a result, any variation captured by the device allows use of the first term to assess system stability. Thus, a state estimation will be performed for all future t values until the next variation, by adding the current dynamics to the previous state.

Further characteristics of the invention will form the subject of the annexed claims, which shall be intended as integral part of the present disclosure.

BRIEF DESCRIPTION OF THE DRAWINGS

The above objects will appear more clearly upon reading the detailed description of the method of managing electric energy consumption and/or production and the device therefor, particularly referring to the accompanying Figures, in which:

FIG. 2 shows a flow diagram of a method of managing electric energy consumption and/or production dynamics according to the invention;

FIG. 3 shows an exemplary meta-code implementing the method as shown in the flow diagram of FIG. 2;

FIG. 6 shows an exemplary meta-code to be used by the network computer of FIG. 5.

DETAILED DESCRIPTION OF THE PREFERRED EMBODIMENTS

Figure 1:
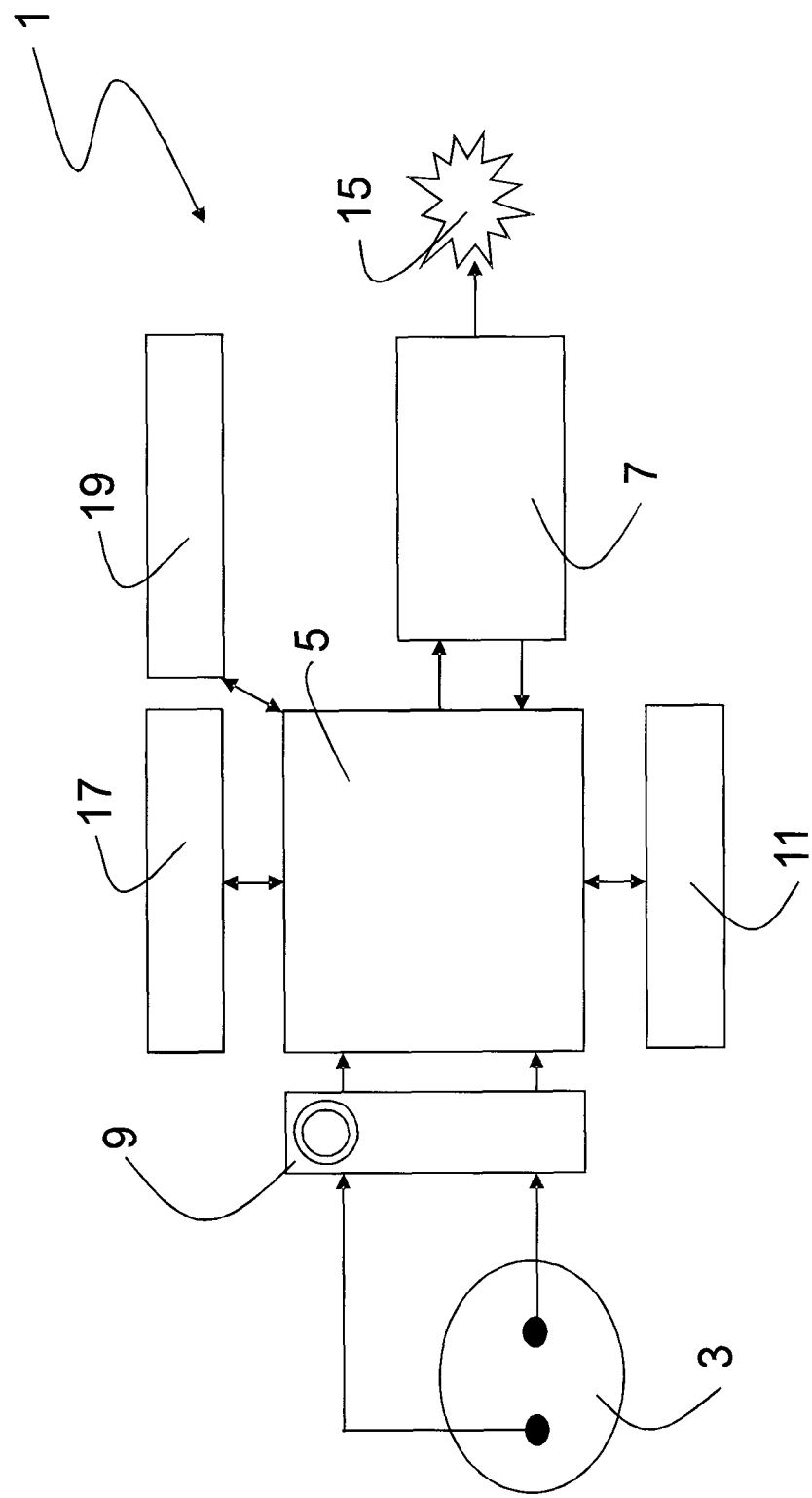
FIG. 1 shows a block diagram of an electricity metering device according to the invention.

Referring to FIG. 1, an electricity metering device 1 is shown, which comprises: a source 3 of an electric energy signal to be measured; a digital measuring circuit 5 comprising an integrated microchip with an onboard microprocessor; a communication unit 7 for transmitting messages to a network 15, preferably operating with a power line technology, as the protocol in use should ensure timely delivery of messages to the recipient; voltage and current sensing means 9; memory means 11; power supply means 19 for the device 1; and a user interface (not shown), such as a LCD screen.

The voltage and current sensing means 9 include an analog sensor or module, which preferably consists of a Rogowski coil, a current transformer, a resistive shunt, a resistive voltage divider or another suitable sensor.

The electricity metering device 1 may further include indicator means 17, namely an acoustic or optical alarm or a display (e.g. of LED, LCD, or other type).

Referring to FIG. 2, a method 100 will be now described for managing electric energy consumption and/or production dynamics according to the invention.

In step 102, parameters are initialized for determining the following quantities, whose meaning will be better explained below:

"$E_{prev}$": amount of previously metered energy;
"$E_i$": amount of currently metered energy;
"$\Delta E_{prev}$": previously metered variation;
"$\Delta E_i$": currently metered variation;
"sum": sum of minor variations to current time.

Also, in step 102, a constant is selected for a threshold value $\delta_{DE}$, which sets the amplitude of an admissible variation range, and a minor variation filtering threshold is also selected, for such variations to be deemed as individually negligible.

Various options are allowed for the threshold value $\delta_{DE}$, which may consist of a fixed constant or a predetermined percentage of the amount of metered energy.

In residential applications, threshold values $\delta_{DE}$ may be 50, 100, and 200 Wh (watthour).

For any particular use of the inventive method, the threshold value $\delta_{DE}$ may be selected either empirically, through the observation of a collection of previously captured load shapes, or through the use of advanced optimization techniques, such as "soft computing".

The purpose of the threshold value $\delta_{DE}$ is to set a compromise between the sensitivity of the instrument and the ability of compressing the data volume to be transmitted.

A proper threshold value $\delta_{DE}$ will be selected by maintaining any nomothetic (i.e. repetitive) cycle, and by providing improved filtering of stochastic "noise" events, such as turning on of low-power-consumption lamps or the like, which events are negligible for the change of the energy system state.

Assuming for example a house having lamps (absorbing 7, 11, 15 and 18 Wh each), TV sets and other similar small appliances, and assuming the predominance of energy-consuming appliances, such as an air conditioning system (absorbing 2 kWh), an iron (absorbing 2 kWh), a washing machine (absorbing 2 kWh for heating and 300 Wh for its motors), a dishwasher (absorbing 2 kWh for heating and 120 Wh for its motors and pumps), a refrigerator (absorbing 120 Wh) and similar heating, ventilation, and air conditioning devices, a proper threshold $\delta_{DE}$ would be higher than the consumption of each lamp and lower than the power absorbed by the motors of the washing machine, dishwasher and refrigerator, and hence, for instance 99 Wh.

This threshold value $\delta_{DE}$ may be also dynamically set using intelligent self-learning techniques, as described in the art.

In step 104, the value of the meter i is increased by 1.

In step 106, the electricity metering device 1 measures and totals "k" instantaneous electric energy flow values, and particularly instantaneous voltage values $V_i$ and instantaneous current values $I_i$. In the same step, instantaneous electricity values $E_i = V_i \cdot I_i \cdot \Delta t$, are also calculated, where $\Delta t = t_i - t_{i-1}$, i.e. a time interval between two successive times.

The value Ei can be calculated with a discrete numerical method, i.e. with $$E_i = \sum_{i=0}^{k} [V(t_i) \cdot I(t_i) \cdot \Delta t],$$

where the values $E_i$ are consolidated every k cycles (50 Hz alternate current in Europe or 60 Hz in certain other countries), and in which the k value preferably ranges from 5 to 10.

Unlike PMUs, whose operation is based on phasors, the device of the present invention operates with scalar values, and is required to total sums by integral calculus.

Since integral sums are periodic functions with period $\omega$, they shall be mutually comparable. For example, this may occur by monitoring zero-crossing times, or by extending the duration of multiple integration of the period $\omega$.

Nevertheless, the k value shall maintain compatibility with the system control function, allowing the user to respond before experiencing an adverse effect, such as under-frequency.

The less computationally expensive option is selected, i.e. the integral sum in k cycles, where k preferably ranges from 5 to 10.

The integration interval is long enough to allow comparison of the sums and allows timely response by a control system.

A second consideration to be made about the selection of the k parameter is associated with exchanged data volumes and controllability. If a k value=10 is selected, the maximum frequency of DE messages in Europe will be 0.2 seconds (a k value=50 would increase the maximum frequency to 1 second and so on).

The "event-driven" method of the present invention is thus expected to provide exchanged data volumes similar to state-of-the-art "time-driven" methods, with longer time intervals (e.g. 15-minute intervals in current metering).

At step 108 a variation $\Delta E_i$ is calculated, with $\Delta E_i = (E_i - E_{prev})/\Delta t$, where $E_{prev}$ is instantaneous energy value calculated at time t−1, or at the previous cycle.

In step 110 the parameter "sum" is increased by the value $\Delta E_i$ as determined in step 108, to obtain a cumulative sum of values.

In step 112 a check is made to see whether the absolute value of an individual variation $\Delta E_i$ is higher than the predetermined threshold $\delta_{DE}$ (fast trend). If it is, the flow diagram moves to step 116, if it is not, the flow diagram continues with step 114.

In step 114 a check is made to see whether the absolute value of the parameter "sum", i.e. the sum of minor variations, is higher than the predetermined threshold $\delta_{DE}$ (slow trend). If it is not, the flow diagram moves to step 104. If it is, the process moves to step 116.

In step 116, a message is sent over the network 15 by the electricity metering device 1. If the variation as described in steps 112 and 114 is higher than the threshold $\delta_{DE}$, this will be indicative of dynamics that might affect the steady state of the local power system comprising the device 1.

The format of the electronic message may change according to actual implementations. Nevertheless, the message shall contain at least:
- an attribute indicating the identity of a remote node of the network 15, e.g. the ID of the device 1;
- a timestamp for the measuring time;
- information about the electric energy values that triggered message transmission, such as one of the pairs of attributes: $(E_{prev}, E_i)$; $(E_{prev}, \Delta E_i)$; $(\Delta E_i, E_i)$.

The "push" mode, i.e. the transmission of data from the device 1 to the network 15 advantageously allows control of the system comprising the device 1. Due to message timestamps, messages may be sorted by time and be processed by a provider's server in "stateless" mode. For this purpose, two instantaneous electric energy values are provided in the message, i.e. previous and current values, which are related by the formula $E_i=E_{prev}+\Delta E_i$, and allow determination of the third value of the formula.

The message may further contain:
- an attribute indicating the message recipient (one recipient for unicast, a group for groupcast, or all recipients for broadcast);
- a variation attribute indicating the variation type that triggered the message; if the message was triggered by the test of step 112, then the variation attribute is "fast"; if the message was triggered by the test of step 114, then the variation attribute is "slow".

The information in the message is appropriately examined by the network manager 15, or by other nodes of the network operated by the network manager 15, as being useful for control purposes (SCADA) or else.

Once the message has been transmitted, in step 118, the parameters "sum" and the meter "i" are set to zero, whereas the parameter "$\Delta E_{prev}$" is set to "$\Delta E_i$" and the parameter "$E_{prev}$" is set to the last value "$E_i$".

One exemplary meta-code implementing the method 100 is shown in FIG. 3.

Certain contracts restrict maximum energy consumption by a user, e.g. to 3 kWh. Some tolerance is typically allowed as this limit is exceeded, which tolerance is also expressly set forth in contract documents. For example, the maximum energy limit may be allowed to be exceeded by not more than 30% for 5 minutes, or by more than 30% for not more than 10 successive times. In these cases, the user should be acoustically warned about the occurrence of these conditions, to avoid cut-off from the network.

If the electricity metering device 1 is associated with a user subjected to contract limitation of maximum consumed power (e.g. 3 kWh), and if the variations $\Delta E_i$ or the parameter "sum" are equal to or higher than the maximum allowed values for a time e.g. equal to half the time after which the electric company actually cuts off electricity (here 2.5 minutes), the electricity metering device 1 acoustically warns the user about the forthcoming risk of electricity cut-off, thereby leaving enough time (here 2.5 minutes) to reduce consumption.

Upon occurrence of such condition, the electricity metering device 1 may emit an acoustic and/or optical alarm by the alarm means 17, to notify the user of a possible forthcoming electricity cut-off.

Such notification may be transmitted to the network manager, to possibly prevent such cut-off, e.g. by increasing the maximum electric energy value allowed to the user for a period of time (dynamic threshold).

Figures 4A, 4B:
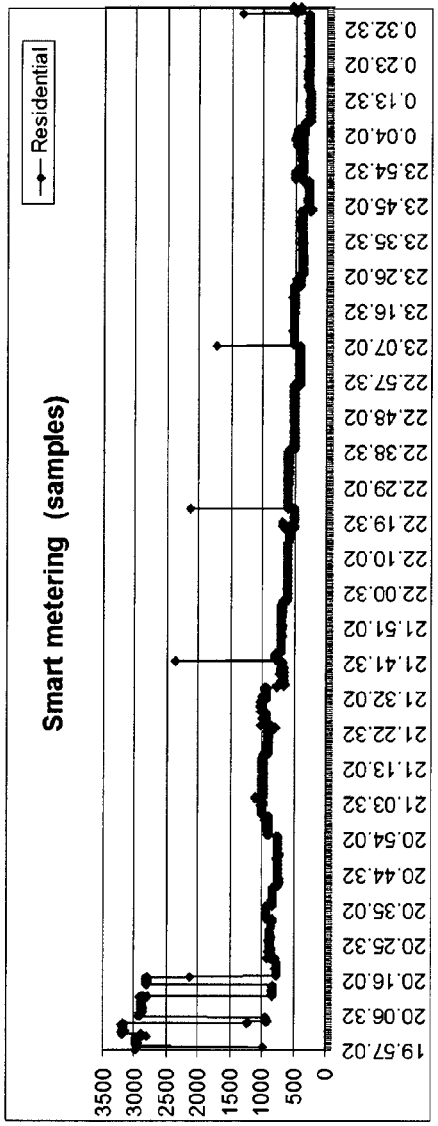
FIGS. 4a and 4b show two charts, which highlight advantageous aspects of the method of the present invention as compared with the prior art.

Referring to FIGS. 4a and 4b, two comparative charts are shown. The top chart of FIG. 4a describes the behavior of a prior art electricity metering device, in which the metering device transmits one sample of measured values per second (3600 samples per hour) over the network, because such samples are measured with a "time-driven" logic, i.e. at predetermined time intervals; the bottom chart of FIG. 4b describes an electricity metering device 1 implementing the method of the present invention, in which the samples transmitted in the same period of time are dramatically decreased to 77 (in 4 hours and a half), because the method of the present invention uses an "event-driven" logic, which means that the values are only transmitted upon occurrence of given events, i.e. when the measured values fall out of the admitted range $\delta_{DE}$.

A network computer, or server, receives and processes dynamics from the networked devices 1. The server can process the data that come from a network segment or a group of network nodes for balancing or other business purposes.

Referring to FIG. 5a, the server 20 in the network continuously listens to the messages from the metering devices 1 which calculate variations at the remote nodes, as the latter use the push mode. Unlike PDC servers and other servers that operate with instantaneous datasets, the server 20 accomplishes various artificial intelligence tasks, and processes historical data series, past and present dynamics. As it continuously listens to infinity, it divides time into time frames, i.e. blocks of a given duration (above the k value of the devices 1), e.g. from 100 to 200 ms. At the start of the time frame, its counters are set to zero. The server counts the messages it receives, $n=Count(DE_i(t))$, and analyzes them.

Each message it receives increases the total number of variations: by definition, this amount of dynamics indicates the intensity of the variation flow. The intensity of the variation flow $Count(DE_i(t))$ is considered, as it is deemed to be significant for network stability. At the end of the time-frame the overall energy unbalance of the network topology is assessed, considering that certain positive variations may be nullified by negative variations from different nodes.

In addition to the counter for time frame variations, a total counter is used, which stores cumulative variations, as well as the trend. Cumulative values and variation intensities are useful for the purpose of network control, as a great number of events and/or their relevance may affect stability and/or quality of energy.

A fuzzy logic predicate (FIG. 6, right column), which determines whether there are too many events (IF $C>=C_{min}$) or whether there are excessively abrupt variations, or whether there is an accumulating trend (IF Ep>=Emax) triggers anomalies, thereby providing a control function.

Any intelligent control action based on these counters and/or any interaction with SCADA control systems are as provided in prior art load management algorithms, or in feed-forward control, where possible.

The control action may also include one or more of the following actions: network load limitation, assessment of states and/or state transitions and/or network stability, prediction of energy amount for the next period based on variations, addition of generators.

Advantageously, the control action may be carried out at any node of the network, particularly on a metering device (1) and/or a computer (20), which detects a variation in a single network section at two different times.

The computer 20 may share its estimates with the nodes of the distribution network for general optimization of the nodes.

An example of the natural phenomenon of variable cloudiness, which affects photovoltaic energy generation is addressed in M. Simonov, F. Grimaccia, M. Mussetta, R. Zich, Modello di gestione dell'energia solare in tempo reale, in Journal AEIT, 1 (2011), pp. 24-29, Milano, Italy.

The flow of events, which have been only used heretofore as independent events, is used to calculate a synergy between nodes, deriving from mutual knowledge of the times at which production losses occur. The observation of propagation features, as well as the phenomenon-describing rules, provide control criteria: for example, if a loss occurs in node A at time $t_1$, and a loss occurs in node B at time $t_2$, then a loss will also occur in node C at time $t_3$, and hence the control action may consist in turning on a generator D before time $t_3$.

The invention provides a flow of events from one or more devices 1, that normally occur during actual electricity use. The flow of actual use events DE introduces new semantic knowledge into the digital world, allowing for novel decision-making processes in the so-called smart grids.

Figure 5:
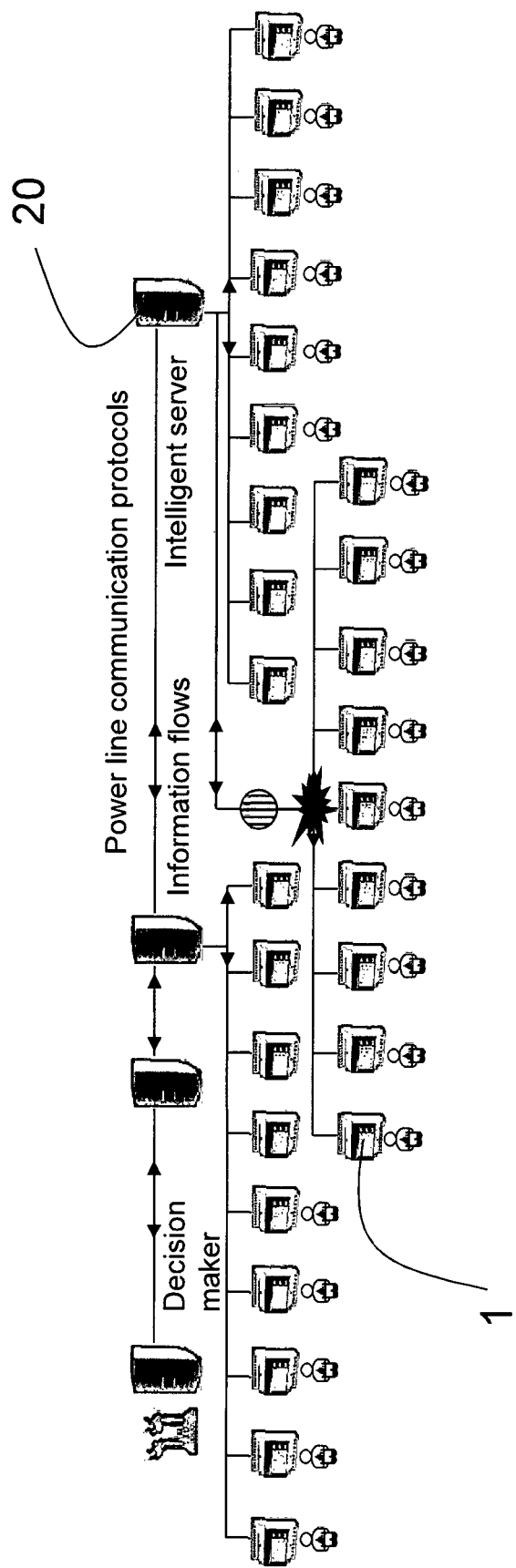
FIG. 5 shows a system comprising a plurality of metering devices according to the invention and at least one network computer.

Referring now to FIG. 6, an exemplary meta-code implemented in the server 20 of FIG. 5 is shown.

The above disclosure clearly shows the characteristics of the present invention, as well as its advantages.

A first advantage of the present invention is that data exchange between an electricity metering device and an electricity manager that manages such device is dramatically reduced, because data are only transmitted upon occurrence of an event, i.e. when a typically predetermined threshold (e.g. selected by the network manager, the electrical company or the user of the device) is exceeded.

While a prior art meter provides a time-driven load shape of n objects $\{(E_1,t_1), \ldots, (E_i, t_i), \ldots, (E_n, t_n)\}$, in which $|t_i - t_{i-1}|$=constant, the device according to the invention provides a series with a smaller number of terms $\{(\Delta E_1, t_1, \ldots), \ldots, (\Delta E_i, t_i, \ldots), \ldots\}$, because if no variation occur during certain periods $[t_k:t_k+\Delta t_k]$, $[t_j:t_j+\Delta t_j]$, $[t_m:t_m+\Delta t_m]$ and so on, then their values, and all the individual components in the formula, remain unchanged. Therefore, less data are provided as compared with a "time-driven" series.

A combined observation method, comprising a prior art time-driven metering component $\{\ldots, (E_i, t_i), \ldots\}$ at less frequent intervals $|t_i - t_{i-1}|$=10-20 minutes, and possibly with variable sampling times, i.e. not with regular and constant time intervals, and a novel event-driven real-time continuous observation component, which interposes additional elements $(\Delta E_k, t_k, [E_{prev}], \ldots)$ is highly advantageous, as it involves a minor increase of data traffic volumes, as compared with the prior art.

Experimental comparison of time-driven methods at 15 minutes and 0.1 seconds, i.e. with 96 and 864,000 daily data elements respectively, with the above mentioned combined method, shows that the latter adds a few hundreds of significant power system dynamics, corresponding to as many actual events, thereby avoiding the prior art large data volumes.

A second advantage of the present invention is that the device according to the present invention affords management of both "consumer" power system dynamics, and "producer" dynamics, both measures being taken at the same time ("prosumer"). Any flow reversal will only cause a change of sign of the measured scalar value. Therefore, the system can stay close to a balance condition defined by the range $-\delta_{DE} < \Delta E_i < +\delta_{DE}$, and conveniently manage a combined user type ("prosumer").

A third advantage of the present invention is anticipation of the expected value. Adjacent energy flow variations caused by an external agent are always distant in time, and hence a variation $\Delta E_i$ qualifies a past period, and also predicts the next time frame $E_{i+1} = E_i$ in the event that no further variations exist.

A further advantage of the present invention is that the volume of significant data transmitted over the network is dramatically reduced. Due to the maintenance of the previous values when no variation occurs, there is no need to repeat the same values, like in all data compression algorithms. Any redundancy would be reflected in the additional attribute $E_{next}$, as well as the variation $\Delta E_i$ itself, in the data package.

The method and device of the present invention may be used by: a manager of a network for distribution of any level of electric energy (low voltage, medium voltage or high voltage); any local sub-topology; owners of renewable energy sites; various participants in the electricity value chain.

A use of the method of the present invention involves the employment of a plurality of networked devices, interoperable by DE message broadcasting, to provide real-time proactive load balancing.

Instead of measuring energy quality based on the occurrence of under-frequency, i.e. a frequency of less than 50 or 60 Hz/rated values, which is a consequence of excessive electricity consumption and not a cause, the invention uses a central computer (the equivalent of the PDC of prior art phasor measurement by PMUs) to measure the individual dynamics of the electricity metering devices and their superpositions (sums) at any level.

Since the method of the present invention can capture events susceptible of causing network imbalance (i.e. their causes), such capture occurs before their consequences (i.e. under-frequency).

Typically, the power flow is directed from high and medium voltage segments to low voltage segments in the electric network. In case of distributed electricity generation, flows might be reversed. This might be detrimental for users.

Calculation of power system dynamics with the method of the present invention provides computationally easier acknowledgement of any unbalance between directional flows anytime. The system remains in its steady state until dynamics-altering events occur. Dynamics are detected by the method of the present invention. Therefore, the system has real-time knowledge of such dynamics and can calculate flow reversals and take the required actions.

The method of the present invention is particularly useful for energy brokers operating in the free market, as it allows real-time observation of electric energy consumption/production dynamics, and can capture the causes of such dynamics, instead of analyzing their consequences. Forward energy demand calculations and optimization of purchases over the liberalized market can advantageously provide considerable savings.

Also, electric network segments may be dynamically partitioned to obtain a desired energy behavior, e.g. by avoiding electricity injection into the backbones (total local consumption).

The method of the present invention may be further used by a panel of renewable-source energy producers (producing energy from solar or other similar sources), operating in autonomous, independent manners. The method of the present invention advantageously allows detection of events such as production losses (e.g. due to a weather factor, such as a cloud in case of photovoltaic energy generation, or any other external agent).

Instead of calculating a separate probability forecast for each network node, the method of the present invention allows utilization of the retrieved knowledge for global optimization. Therefore, the first node affected by a detrimental phenomenon may transmit a message over the network to warn the neighboring nodes. This event is received by other network partners and may be used to anticipate the decisions and/or control required to address the forthcoming loss also by said partners, due to the displacement of the phenomenon.

In the prior art, load balance is based on probability forecasts. The method of the present invention increases prediction accuracy, due to non-probability components. Improved load prediction can reduce imbalance.

For example, electricity production from wind and solar sources in Italy, in 2009, was 66 TWh, amounting to more than 660 million euros (10 eurocents/kWh). The estimated 2% imbalance may be further reduced. The method of the present invention, assuming a 50% contribution (as random components are replaced by certain terms), will provide savings for 0.13 TWh/year, i.e. about 6.6 million euros/year.

Many variants may be envisaged for the method of managing electric energy consumption and/or production dynamics and the device therefor, as disclosed herein as an example, without departure from the novel concepts of the invention, and the disclosed details may be implemented in different manners, or replaced by technically equivalent parts.

Therefore, it will be appreciated that the present invention is not limited to a method of managing electric energy consumption and/or production dynamics and a device therefor, but is susceptible to various modifications, improvements, replacements of equivalent elements and parts, without departure from the scope of the invention, as better defined in the following claims.

The invention claimed is:

1. A method of managing electric energy consumption and/or production dynamics in an electricity metering device, comprising the steps of:
   sampling an electric energy flow through a given node of a network of an electric company by an electricity metering device belonging to said network;
   calculating at said node by a digital metering circuit of said electricity metering device a time-divided energy variation $\Delta E_i = (E_i - E_{i-1})/\Delta t$ at regular intervals, where $E_i$ is an integral sum value of electric energy consolidated over a first number of cycles and $E_{i-1}$ is an integral sum value of electric energy consolidated over a second number of cycles that occur after the first number of cycles and $\Delta t$ represents a time interval between the respective times of the first number of cycles and the second number of cycles at which said two integral sum values are obtained;
   adding said variation ($\Delta E_i$) to analogous variations calculated by said electricity metering device at the same node at previous time instants, to obtain a cumulative sum of such variations;
   determining by said electricity metering device whether said variation and/or said cumulative sum detected at said node exceed a predetermined threshold value ($\delta_{DE}$), wherein said metering device is configured to meter the electric energy consumed and/or the electric energy produced by a user of the electric company; and
   transmitting by a communication unit of said electricity metering device a message over said network if said variation and/or cumulative sum detected at said node exceed said predetermined threshold value ($\delta_{DE}$).

2. The method as claimed in claim 1, wherein said predetermined threshold value ($\delta_{DE}$) is a constant value.

3. The method as claimed in claim 1, wherein said predetermined threshold value ($\delta_{DE}$) is a percentage value of a measured amount of electric energy.

4. The method as claimed in claim 1, wherein said predetermined threshold value ($\delta_{DE}$) is obtained empirically, through the observation of a collection of previously captured load shapes.

5. The method as claimed in claim 1, wherein said given number of cycles is a value ranging from 5 to 10.

6. The method as claimed in claim 1, wherein said message comprises:
   an attribute indicating the identity of said electricity metering device;
   information about the electric energy values that triggered the transmission of said message;
   a timestamp.

7. The method as claimed in claim 6, wherein said message further comprises one or more message recipients and/or the type of variation that triggered the transmission of said message.

8. The method as claimed in claim 1, wherein said electricity metering device is associated with an electricity user and, if the variations and/or said cumulative sum exceed a maximum electric energy value for a given time, then such metering device cuts off electricity.

9. The method as claimed in claim 8, wherein, prior to said cut-off, said electricity metering device emits a notification, particularly an acoustic or optical notification.

10. The method as claimed in claim 9, wherein said notification is transmitted to a network manager, to prevent said cut-off, by increasing said maximum electric energy value for a period of time.

11. The method as claimed in claim 1, wherein said network comprises a network computer which is adapted to manage said consumption and/or production dynamics, said network computer being able to process the data that come from a network segment or a group of network nodes for balancing purposes.

12. An electricity metering device comprising:
   an analog module for detecting electric voltage and current at a given node of a network of an electric company;
   a communication unit for transmitting messages, and
   a digital metering circuit, which is configured to provide instantaneous electric voltage and current values at said node and to calculate a time-divided energy variation $\Delta E_i = (E_i - E_{i-1})/\Delta t$ occurring at said node at regular intervals, where $E_i$ is an integral sum value of electric energy consolidated over a first number of cycles and $E_{i-1}$ is an integral sum value of electric energy consolidated over a second number of cycles that occur after the first number of cycles and $\Delta t$ represents a time interval between the respective time instants of the first number of cycles and the second number of cycles at which said two integral sum values are obtained, and to add said variation ($\Delta E_i$) to analogous variations calculated at the same node at previous time instants, to obtain a cumulative sum of such variations,
   wherein said communication unit transmits a message over a network if said variation and/or said cumulative sum detected at said node exceed a predetermined threshold value ($\delta_{DE}$),
   wherein said metering device is configured to meter electric energy consumed and/or the electric energy produced by a user of the electric company.

13. The device as claimed in claim 12, wherein said analog module comprises a Rogowski coil.

14. The device as claimed in claim 12, wherein said message is transmitted over said network using a power line protocol.

15. A method of managing electric energy consumption and/or production dynamics in an electric energy distribution network, comprising a plurality of metering devices which operate according to the method as claimed in claim 1, and at least one computer for receiving and processing messages transmitted by said plurality of devices, wherein said computer:

receives said messages and processes attributes contained therein;

counts the number of messages received from said plurality of metering devices within a period of time, as an indicator of event intensity;

totals the electric energy variations that took place in said period of time over said plurality of metering devices;

calculates the cumulative trend of electric energy variations over said period of time;

and if the amount of said received messages exceeds a first threshold ($C_{MIN}$) and/or said totaled variations exceed a second threshold ($E_{MAX}$) and/or said cumulative trend exceeds said second threshold ($E_{MAX}$), it generates a control action on said distribution network.

16. The method as claimed in claim 15, wherein said control action includes one or more of the following actions: network load control, feed-forward control, assessment of network state and/or stability.

17. The method as claimed in claim 15, wherein said control action comprises a predictive calculation to predict the amount of energy for the next period, based on said variations.

18. The method as claimed in claim 15, wherein said computer shares its estimates with the nodes of said network for the purpose of general optimization.

19. The method as claimed in claim 15, wherein said method may be carried out at any node of said network, particularly on a metering device and/or a computer, which detects a variation in a single section of said network at two different times.

20. A method of managing electric energy consumption and/or production dynamics in an electricity metering device, comprising the steps of:

sampling an electric energy flow through a given node of a network of an electric company by an electricity metering device belonging to said network;

calculating at said node by a digital metering circuit of said electricity metering device a time-divided energy variation $\Delta E_i = (E_i - E_{i-1})/\Delta t$ at regular intervals, where $E_i$ is an integral sum value of electric energy consolidated over a first number of cycles and $E_{i-1}$ is an integral sum value of electric energy consolidated over a second number of cycles that occur after the first number of cycles and $\Delta t$ represents a time interval between the respective times of the first number of cycles and the second number of cycles at which said two integral sum values are obtained;

adding said variation ($\Delta E_i$) to analogous variations calculated by said electricity metering device at the same node at previous time instants, to obtain a cumulative sum of such variations;

determining by said electricity metering device whether said variation and/or said cumulative sum detected at said node exceed a predetermined threshold value ($\delta_{DE}$), wherein said metering device is configured to meter the electric energy consumed and/or the electric energy produced by a user of the electric company; and transmitting by a communication unit of said electricity metering device a message over said network if said variation and/or cumulative sum detected at said node exceed said predetermined threshold value ($\delta_{DE}$), wherein said message includes information about the electric energy values of said variation and/or said cumulative sum that triggered the transmission of said message.

21. The method as claimed in claim 20, wherein said message comprises:

an attribute indicating the identity of said electricity metering device; and a timestamp.

* * * * *